United States Patent
Chun et al.

(10) Patent No.: US 11,887,920 B2
(45) Date of Patent: Jan. 30, 2024

(54) REDISTRIBUTION LAYERS INCLUDING REINFORCEMENT STRUCTURES AND RELATED SEMICONDUCTOR DEVICE PACKAGES, SYSTEMS AND METHODS

(71) Applicant: Micron Technology, Inc., Boise, ID (US)

(72) Inventors: Hyunsuk Chun, Boise, ID (US); Chan H. Yoo, Boise, ID (US); Tracy N. Tennant, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/952,703

(22) Filed: Nov. 19, 2020

(65) Prior Publication Data
US 2021/0074623 A1 Mar. 11, 2021

Related U.S. Application Data

(63) Continuation of application No. 16/106,791, filed on Aug. 21, 2018, now Pat. No. 10,861,782.

(51) Int. Cl.
H01L 23/498 (2006.01)
H01L 21/48 (2006.01)
H01L 23/31 (2006.01)
H01L 23/00 (2006.01)

(52) U.S. Cl.
CPC .... *H01L 23/49838* (2013.01); *H01L 21/4857* (2013.01); *H01L 23/3128* (2013.01); *H01L 23/49822* (2013.01); *H01L 23/562* (2013.01)

(58) Field of Classification Search
CPC .................................................. H01L 23/49822
See application file for complete search history.

(56) References Cited

U.S. PATENT DOCUMENTS

| | | | |
|---|---|---|---|
| 6,720,502 B1 | 4/2004 | Alcoe et al. | |
| 8,084,871 B2 | 12/2011 | Rahim et al. | |
| 8,421,211 B2 | 4/2013 | Kang et al. | |
| 8,981,551 B2 | 3/2015 | Delpech et al. | |
| 9,379,065 B2 | 6/2016 | Keser et al. | |
| 9,397,052 B2 | 7/2016 | Park et al. | |

(Continued)

FOREIGN PATENT DOCUMENTS

| | | | | |
|---|---|---|---|---|
| CN | 1753169 A | | 3/2005 | |
| CN | 1753169 A | * | 3/2006 | ........... H01L 23/562 |

(Continued)

OTHER PUBLICATIONS

Taiwanese Office Action for Application No. 094142544, dated Mar. 27, 2020, 14 pages.

(Continued)

*Primary Examiner* — Yu-Hsi D Sun
(74) *Attorney, Agent, or Firm* — TraskBritt

(57) ABSTRACT

Embodiments of a redistribution layer structure comprise a low-k dielectric material and incorporating a reinforcement structure proximate and inward of a peripheral edge thereof, the reinforcement structure comprising conductive material electrically isolated from conductive paths through the RDL structure. Semiconductor packages including an embodiment of the RDL structure and methods of fabricating such RDL structures are also disclosed.

17 Claims, 5 Drawing Sheets

(56) References Cited

U.S. PATENT DOCUMENTS

| | | |
|---|---|---|
| 9,553,059 B2 | 1/2017 | Tsai et al. |
| 2019/0051621 A1* | 2/2019 | Liu .................... H01L 21/4853 |

FOREIGN PATENT DOCUMENTS

| | | |
|---|---|---|
| CN | 107068574 A | 8/2017 |
| CN | 107887363 A | 4/2018 |
| TW | 200504955 A | 2/2005 |
| TW | 200705636 A | 2/2007 |
| TW | 201715661 A | 5/2017 |
| TW | 201743421 A | 12/2017 |
| TW | 201830649 A | 8/2018 |

OTHER PUBLICATIONS

Taiwanese First Office Action for Application No. 109136593, dated Jun. 23, 2021, 13 pages.
Chinese First Office Action for Chinese Application No. 201910769317.4, dated Feb. 17, 2023, 13 pages with translation.

* cited by examiner

REDISTRIBUTION LAYERS INCLUDING REINFORCEMENT STRUCTURES AND RELATED SEMICONDUCTOR DEVICE PACKAGES, SYSTEMS AND METHODS

CROSS-REFERENCE TO RELATED APPLICATION

This application is a continuation of U.S. patent application Ser. No. 16/106,791, filed Aug. 21, 2018, now U.S. Pat. No. 10,861,782, issued Dec. 8, 2020, the disclosure of which is hereby incorporated herein in its entirety by this reference.

TECHNICAL FIELD

Embodiments disclosed herein relate to redistribution layer (RDL) structures for use with semiconductor dice. More particularly, embodiments disclosed herein relate to RDL structures including structural reinforcements to prevent or at least reduce potential for degradation of the RDL structure during processing, handling and operation, to semiconductor device packages and systems including such RDL structures and methods of forming RDL structures including structural reinforcements.

BACKGROUND

It has become increasingly common to employ redistribution layer (RDL) structures with semiconductor dice to reroute power, ground/bias and signal connections from bond pads of a die to a rearranged pattern of external connections, generally with a greater pitch (i.e., spacing) between the external connections of the RDL structure in comparison to the pitch between bond pads of the die. An RDL structure may comprise a single level of conductive traces between two layers of a dielectric material, the traces coupled to an associated semiconductor die through contacts extending from the encapsulated traces to an exposed surface of one dielectric layer and optionally to surface traces, and to higher-level packaging through contacts extending from the traces to external connections in the form of bumps, pillars, balls or studs on an exposed surface of the other dielectric layer. Of course, as complexity of semiconductor dice has increased while, at the same time overall dimensions of dice as well as critical dimensions of features of integrated circuitry of dice have decreased, it has become desirable to fabricate RDL structures with multiple levels of traces, interposed dielectric layers, and interlayer contacts.

One particular application of RDL structures is in fabrication of a so-called "fan-out wafer level package" (FOWLP), where lateral dimensions of the RDL structure extend substantially beyond the periphery of a die to which the RDL structure is secured and operably coupled to provide an array of external connections at a substantially greater pitch than that of the bond pads of an associated semiconductor die. The term "wafer level" is indicative of the fact that some such packages are formed conventionally on a large array of preformed RDL structures or, alternatively, that the RDL structures are formed on a large array of laterally-spaced semiconductor dice. The present and continued scaling, also characterized as miniaturization, of integrated circuitry and, concurrently, semiconductor devices, and associated thinning of dielectric materials, has reached a point where charge buildup and cross-talk may adversely affect performance of a semiconductor device. Thus, in current state of the art FOW RDL structures, it is desirable to employ so-called "low-k" dielectric materials, wherein k is a dielectric constant. A low-k dielectric material may be generalized as a material with a small dielectric constant relative to the dielectric constant k, of 3.9, of $SiO_2$, silicon dioxide. More specifically, a low-k dielectric material may be said to exhibit a dielectric constant k of <3. Utilization of low-k dielectrics enhances radiofrequency performance through reduction in parasitic capacitance, and allowing faster switching speeds, as well as facilitating heat dissipation.

Low-k dielectric materials suitable for use in RDL structures generally comprise polymeric dielectrics, due in large part to the ability to deposit the material using techniques developed for photoresist application, such as spin-on and spray-on techniques, as well as dry film lamination. Examples of organic low-k polymeric dielectrics include without limitation polyimides, polynorborenes, benzcyclobutene (BCB) and polytetrafluoroethylene (PTFE). Examples of silicon-based low-k polymeric dielectrics include hydrogen silsesquioxane (HSQ) and methylsilsesquioxane (MSQ).

While addressing the problems noted above, such polymeric low-k dielectrics suffer from low mechanical strength and thermal stability, resulting in enhanced potential for dielectric layer cracking and delamination than is present with previous conventional silicon or ceramic-based interposer technology, or the use of more physically robust polymer dielectrics in an RDL structure. The substantial lateral extension of the RDL structure beyond the periphery of an associated semiconductor die in a FOWLP results in a number of structural integrity issues. For example, mismatch of a coefficient of thermal expansion (CTE) of various components of a FOWLP, for example the semiconductor die employed in the package, the low-k dielectric and the conductive traces and contacts of the RDL structure, as well as a molding compound encapsulating the die and in contact with the RDL structure induce stress in the package. Further, residual stresses in the FOWLP due to cooling of the molding compound during cure and while adhered to the relatively flexible RDL structure may stress the laminated RDL structure, causing cracking or even delamination. Thermal cycling events such as the encapsulation process with heated molding compound, thermocompression bonding of semiconductor die bond pads to contact pads on the RDL structure, solder reflow of conductive bumps formed on the RDL structure as well as drastic cyclical temperature changes, for example, from about 125° C. to about −40° C. to about −50° C. during package qualification as well as less severe but repeated and protracted thermal cycling during operation of the packaged semiconductor die, may be highly destructive to integrity of the RDL structure and to the FOWLP. Thus, thermal and mechanical stresses applied to RDL structures during fabrication, handling and operation of a completed semiconductor device package employing low-k dielectric materials in an RDL structure may exhibit both increased infant mortality as well as an unacceptably short operational life.

Figure 1:
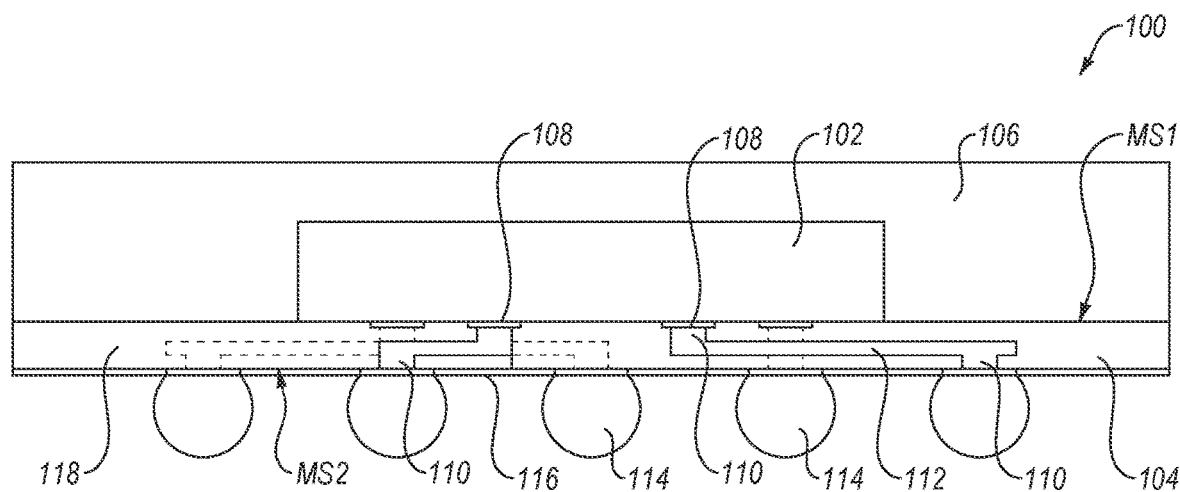
FIG. 1 is a simplified schematic side sectional elevation of a conventional FOWLP.

Due to the nature of the structures illustrated in the drawing figures and described in the specification, section lines indicating different materials have been omitted from the drawings intentionally for clarity.

DETAILED DESCRIPTION

RDL structures are described herein as including peripheral reinforcement structures, such reinforcement structures being fabricated simultaneously with the traces, contacts and other conductive elements of the RDL structure and without the necessity of using different and additional materials or process acts.

The following description provides specific details, such as sizes, shapes, material compositions, and orientations in order to provide a thorough description of embodiments of the disclosure. However, a person of ordinary skill in the art would understand that the embodiments of the disclosure may be practiced without necessarily employing these specific details. Embodiments of the disclosure may be practiced in conjunction with conventional fabrication techniques employed in the industry. In addition, the description provided below does not form a complete process flow for manufacturing a reinforcement structure for an RDL structure, and RDL structure including a reinforcement structure, or an apparatus (e.g., semiconductor device, semiconductor device package, etc.) including an RDL structure incorporating a reinforcement structure according to an embodiment. Only those process acts and structures necessary to understand the embodiments of the disclosure are described in detail below. Additional acts to form a complete reinforcement structure, a complete RDL structure including a reinforcement structure, or a complete apparatus (e.g., a semiconductor device, a semiconductor device package, etc.) including a reinforcement structure from the structures described herein may be performed by conventional fabrication processes.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof. As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art, and does not necessarily require or indicate that a structure "over" another structure is in direct contact therewith. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "within proximity to" in reference to a location of a reinforcement structure of embodiments of the disclosure means and includes locations for the reinforcement structure suitable to prevent delamination of the RDL structure at a peripheral edge thereof, yet far enough inward of the peripheral edge so as to not be susceptible to electrical shorting at the peripheral edge.

In the accompanying drawing figures, like elements are identified by the same or similar reference numerals.

By way of relevant background, RDL structures including those suitable for use in a FOWLP, may be fabricated, layer by layer, using one of two techniques. In one instance, an array of RDL structures is formed on a panel, such as a glass panel or a wafer, by depositing and patterning a conductive layer, such as copper or aluminum, followed by depositing and patterning a polymeric dielectric material to form holes exposing portions of the patterned conductive layer, forming contacts in the holes by conductive material deposition simultaneously with forming conductive traces, followed by deposition and patterning of another dielectric layer until the desired number of trace levels is formed and conductive contact material is exposed on opposing sides of the RDL structure for connection, respectively, to bond pads of a semiconductor die and to conductive elements for connection to higher level packaging. The conductive material may be deposited by electroplating or electroless plating, and patterned using a patterned positive or negative tone photoresist followed by etching. The dielectric material may be applied by spin coating, spray coating or dry film lamination, again followed by pattering using a photoresist, followed by etching. Examples of organic low-k polymeric dielectrics include without limitation polyimides, polynorborenes, benzcyclobutene (BCB) and polytetrafluoroethylene (PTFE). Examples of silicon-based low-k polymeric dielectrics include hydrogen silsesquioxane (HSQ) and methylsilsesquioxane (MSQ). In one embodiment, the dielectric material may itself be a photodefinable dielectric material, for example a polyimide material incorporating so-called "photo pack" chemistry, and patterned using a partially transmissive photomask, commonly termed a "leaky chrome" reticle, to directly pattern the dielectric material, followed by contact with a developer solvent, and cure of the remaining dielectric material in a desired pattern. In another instance, the RDL structure may be formed on a preplaced array of semiconductor dice or wafer segments, and formed layer by layer on the dice or wafer segments as described above. The latter technique may be less suitable for FOWLP applications, as involving preplacement of laterally separated dice or wafer segments in a material matrix before RDL structure is formed.

FIG. 1 is a simplified schematic side sectional elevation of a conventional FOWLP 100 comprising a semiconductor die 102, an RDL structure 104 and a molding compound 106 encapsulating a back and sides of semiconductor die 102 and in contact with a major surface MS1 of RDL structure 104 extending peripherally beyond the footprint of semiconductor die 102. On a side of RDL structure 104 facing semiconductor die 102 (i.e., major surface MS1), bond pads 108 of semiconductor die 102 are operably coupled to contacts 110 of RDL structure 104, which are connected to conductive traces 112 and optionally through other interlayer contacts (see FIG. 1A) and other trace levels (see FIG. 1A), to contacts 110 on the opposing major surface MS2 of RDL structure 104 operably coupled to conductive elements 114 in the form of solder bumps on under bump metallization (UBM), the solder bumps having been reflowed and constrained to desired locations by patterned solder stop 116. The conductive traces 112 are electrically isolated above and below by a low-k dielectric material 118, through which contacts 110 extend.

Figure 1A:
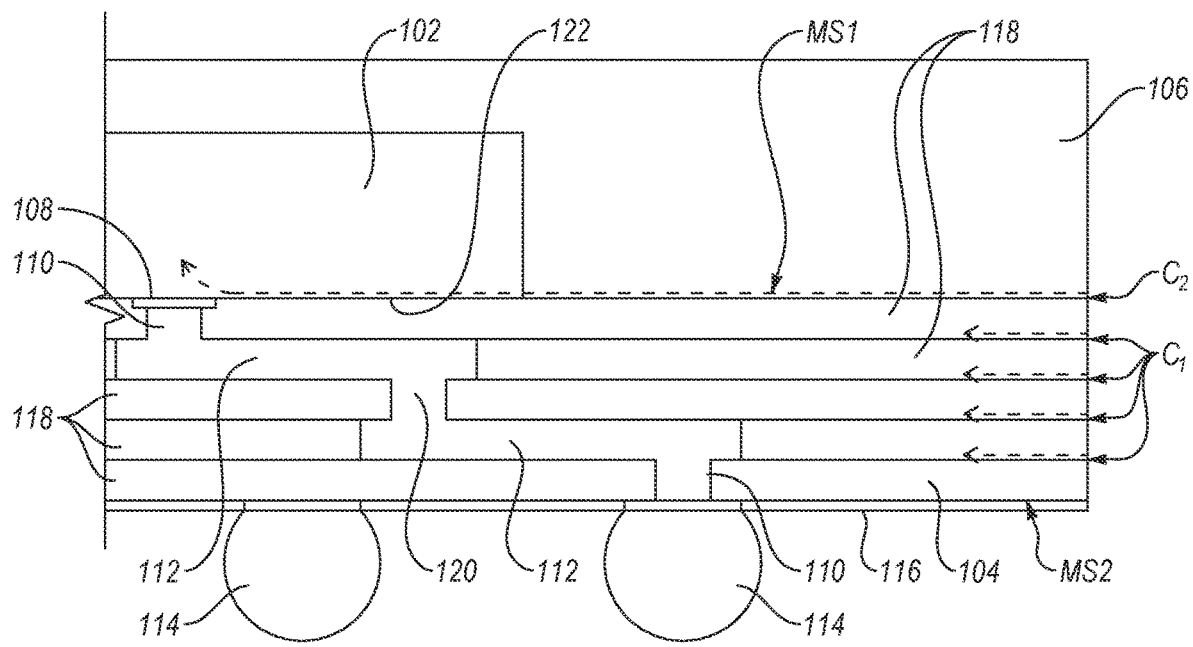
FIG. 1A is an enlarged portion of the right-hand side of FIG. 1 schematically indicating potential crack propagation paths through the FOWLP.

RDL structure 104 may comprise a series of alternating multiple levels of conductive traces 112 and low-k dielectric material 118, as shown in more detail in FIG. 1A. Conductive traces 112 of multiple levels may be mutually connected by interlayer contacts 120, and provided with conductive paths to opposing sides of RDL structure 104 through contacts 110. Contacts 110 and 120 extend through holes in adjacent and surrounding levels of low-k dielectric material 118. Therefore, RDL structure 104 may be characterized as a laminate of conductive and dielectric materials, although the various levels of low-k dielectric material 118 become bonded to one another, and to conductive traces 112 as well as to contacts 110 and 120 during the RDL structure fabrication process. While the RDL structure 104 is, as noted above, relatively easy and economical to fabricate without the use of exotic materials and fabrication techniques, when low-k dielectric materials are employed for the dielectric levels, the somewhat fragile nature of these materials from a mechanical and thermal stress standpoint becomes an issue in terms of maintaining structural integrity of the RDL structure 104.

As indicated by arrows $C_1$ in FIG. 1A, due to mechanical (e.g., bending, shear, torsional) stress and thermal (e.g., elevated temperatures, temperature cycling between elevated and sub-ambient temperatures) stresses, as well as combinations of the foregoing, RDL structure 104 may crack as shown by broken lines by delamination of adjacent levels of low-k dielectric material 118 or through cracks in the low-k dielectric material 118 of a given level, potentially exposing conductive traces 112 to moisture and inducing shorts between adjacent conductive traces 112, or damaging conductive traces 112 or separation from interlayer contacts 120. In another aspect, a crack $C_2$ may form between molding compound 106 encapsulating semiconductor die 102 and RDL structure 104, damaging connections between bond pads 108 and contacts 110, and even extending into the active surface 122 of semiconductor die 102, as shown by a broken line.

Figure 2:
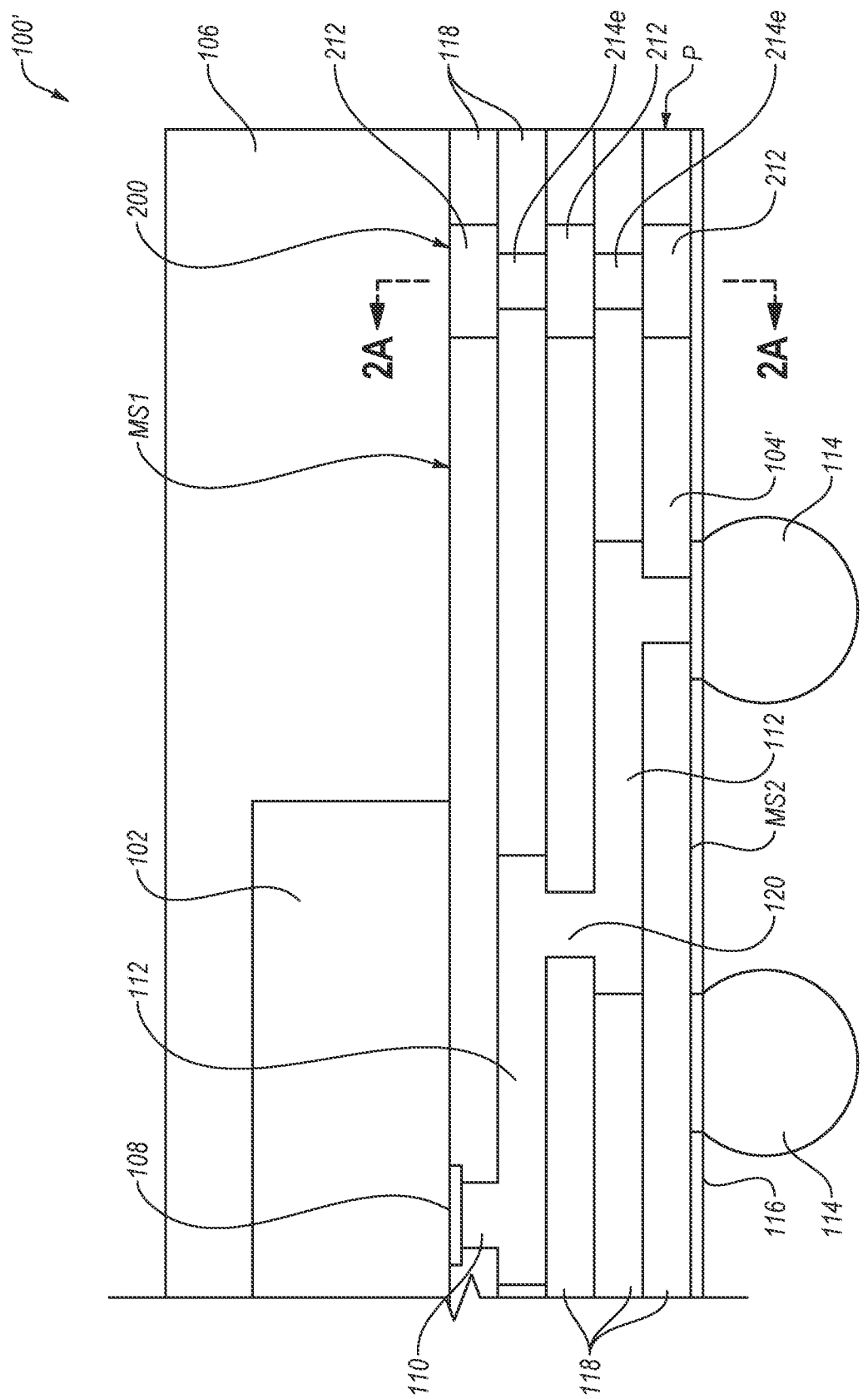
FIG. 2 is an enlarged schematic side sectional elevation of one embodiment of an RDL structure according to the disclosure.
Figure 2A:
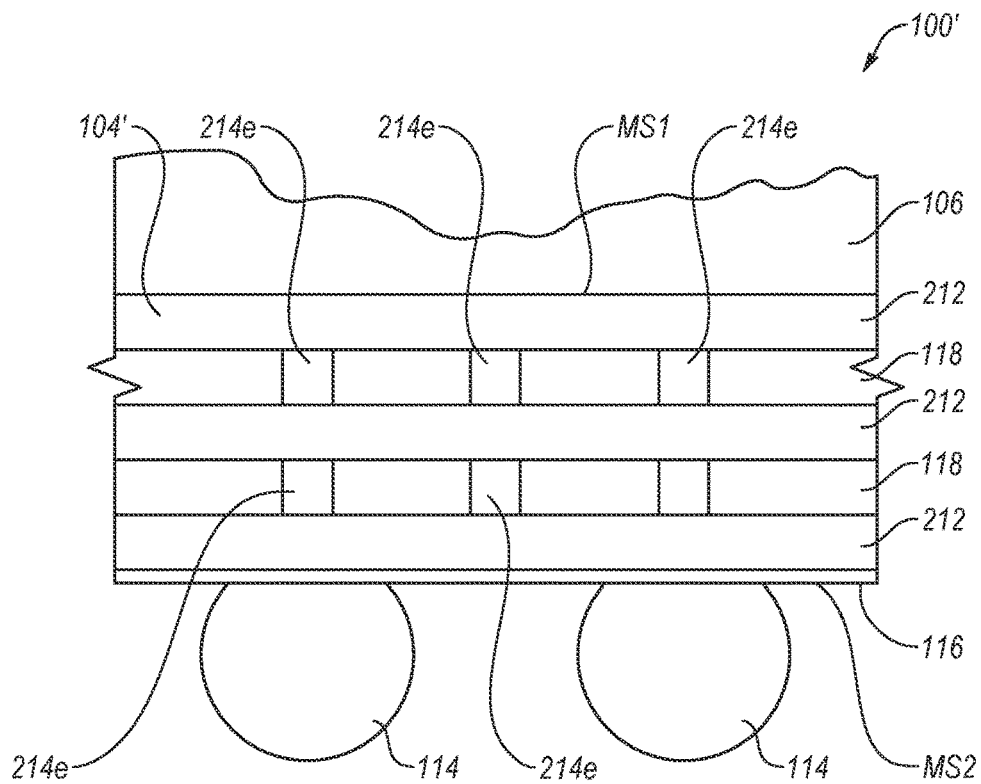
FIG. 2A is an enlarged schematic sectional elevation transverse to FIG. 2 and taken across section line A-A thereof, illustrating one implementation of the embodiment of FIG. 2.
Figure 2B:
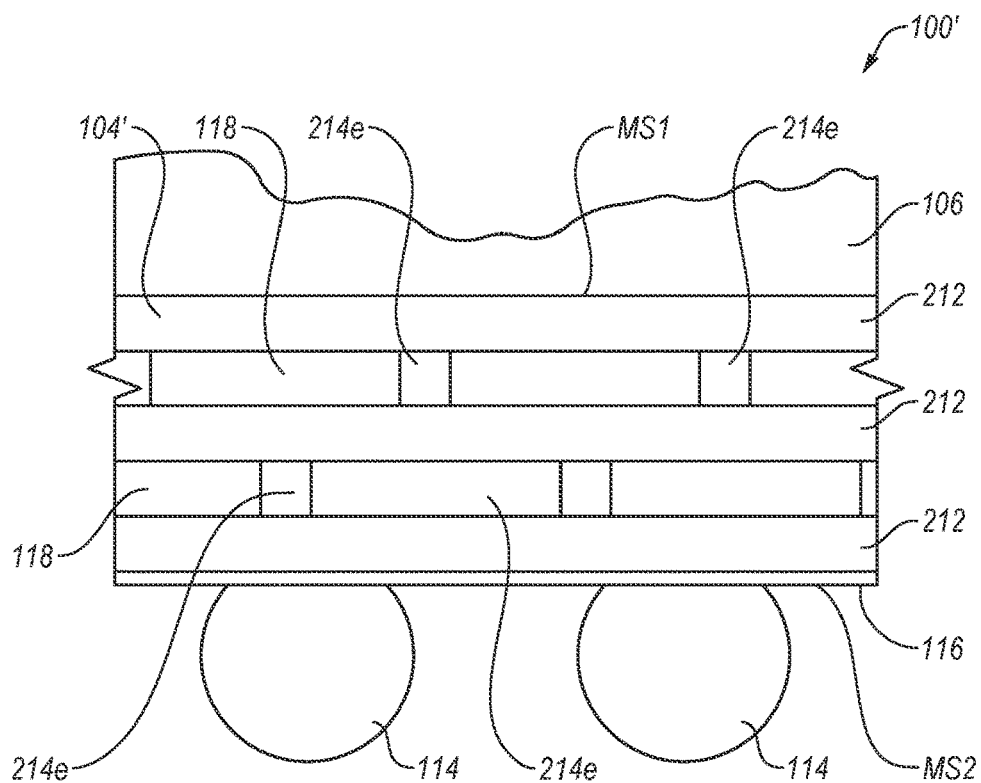
FIG. 2B is an enlarged schematic sectional elevation transverse to FIG. 2 and taken across section line A-A thereof, illustrating another implementation of the embodiment of FIG. 2.

Referring now to FIGS. 2, 2A and 2B of the drawings, one embodiment of a reinforcement structure for an RDL structure is shown. FOWLP 100' comprises a semiconductor die 102 encapsulated in a molding compound 106, which also abuts one major surface MS1 of RDL structure 104'. Bond pads 108 of semiconductor die 102 are operably coupled to contacts 110, or, optionally, to surface traces (not shown), which extend to a first level of conductive traces 112 internal to RDL structure 104'. Interlayer contacts 120 operably mutually interconnect vertically adjacent or non-adjacent levels of conductive traces 112, through holes in intervening levels of low-k dielectric material 118, conductive traces 112 being ultimately coupled to external connections on the major surface MS2 of RDL structure 104' opposing semiconductor die 102. As illustrated, but without limitation, the external connections may comprise solder balls (conductive elements 114) formed or placed on under bump metallization (UBM) surrounded by patterned solder stop 116, as is conventional. Also present in RDL structure 104' is reinforcement structure 200, which is located adjacent to and within proximity to a peripheral edge P of RDL structure 104'.

Reinforcement structure 200 extends between the major surfaces MS1 and MS2 of RDL structure 104', and is electrically isolated from the conductive traces 112 as well as contacts 110 and 120 and from peripheral edge P by intervening low-k dielectric material 118. Reinforcement structure 200 comprises levels of conductive material in the form of linear beams 212 connected vertically by intervening conductive connection elements in the form of columns comprising column elements 214e. Viewed from the perspective of FIG. 2A, it can be seen that the beams 212 may extend laterally between adjacent column elements 214e. As shown, beams 212 may be located proximate, and exposed on, each major surface MS1 and MS2 of RDL structure 104'. In another embodiment, beams 212 may be located below a level of low-k dielectric material 118 on each major surface MS1 and MS2 of RDL structure 104', and the ends of column elements 214e may be exposed. As shown in FIG. 2B, in lieu of continuous vertically extending columns comprising mutually superimposed column elements 214e, column elements 214e on different levels may be laterally offset from one another.

It will be appreciated that reinforcement structure 200 may be formed simultaneously with the remainder of RDL structure 104', by appropriate blanket deposition of levels of conductive material and low-k dielectric material 118 layer by layer in conjunction with appropriate patterning and material removal, as known to those of ordinary skill in the art. Stated another way when, for example, a conductive trace 112 at a particular level is to be formed, blanket deposited conductive material, for example, copper or aluminum, may be masked and etched to not only form conductive traces 112 but also beams 212 at that level proximate periphery P. Similarly, if an interlayer contact 120 is to be formed by deposition of conductive material in a hole in a level of low-k dielectric material 118 alone or in conjunction with a conductive trace 112 over interlayer contact 120, another hole proximate periphery P and opening onto a preformed beam 212 may be simultaneously filled to form a column element 214e. Likewise, with appropriate patterning a beam 212 may be formed simultaneously with a column element 214e extending into a hole in a level of low-k dielectric material 118 below. Of course, beams 212 need not be formed on a same level as conductive traces 112 of a given level; instead, a column element 214e may be formed at that level and an associated beam 212 formed at a level above or below the trace level, so that conductive traces 112 and beams 212 are vertically offset.

Figure 3A:
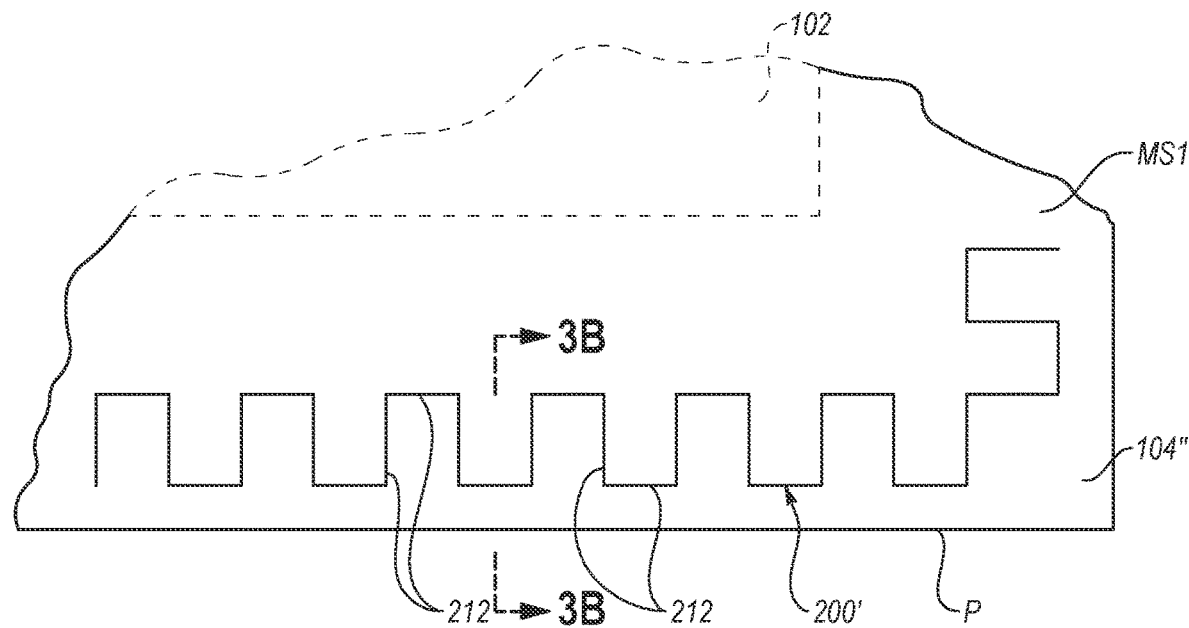
FIG. 3A is a schematic top elevation of another embodiment of an RDL structure according to the disclosure.
Figure 3B:
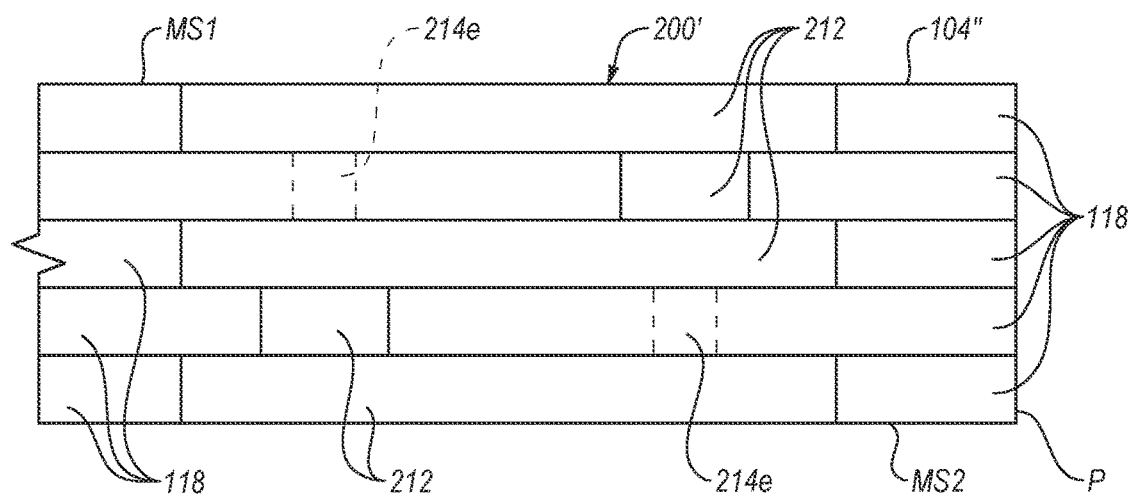
FIG. 3B is an enlarged schematic sectional elevation of a peripheral portion of the RDL structure of FIG. 3A taken across section line B-B of FIG. 3A, perpendicular to a major plane of the RDL structure and perpendicular to an adjacent peripheral edge of the RDL structure.
Figure 3C:
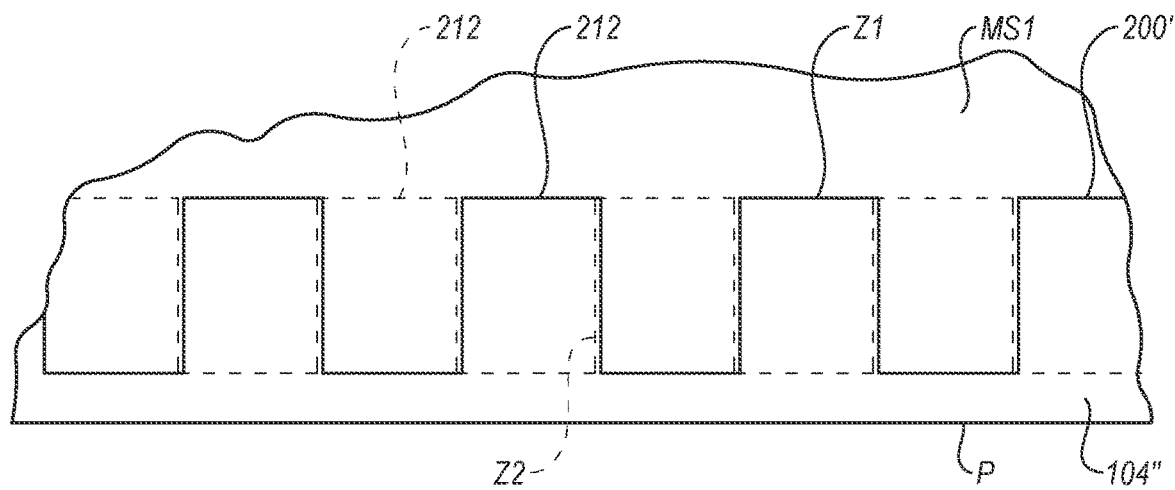
FIG. 3C is a schematic top elevation of another implementation of the embodiment of FIG. 3A.
Figure 3D:
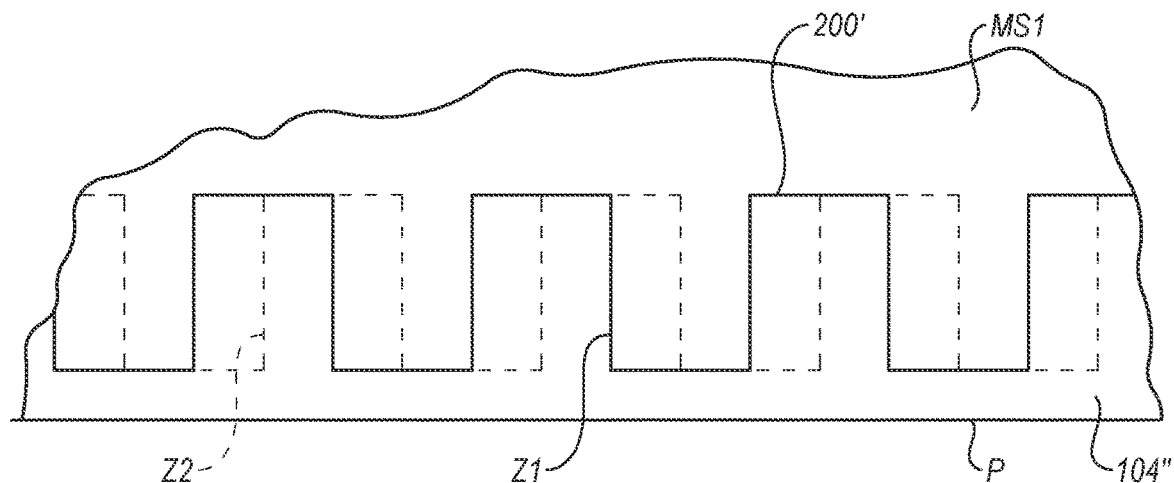
FIG. 3D is a schematic top elevation of a further implementation of the embodiment of FIG. 3A.

FIGS. 3A, 3B, 3C and 3D of the drawings illustrate another embodiment of an RDL structure 104" according to the disclosure. In FIG. 3A, a schematic top elevation, a semiconductor die 102 is depicted in broken lines located on RDL structure 104", and molding compound 106, encapsulating semiconductor die 102 and in contact with major surface MS1 of RDL structure 104", has been omitted for clarity of illustration. As shown, a reinforcement structure 200', as viewed from above, exhibits a continuous zig-zag structure Z approximating a square wave in form and comprising a pattern of linear beams 212 connected end-to-end, every other beam 212 being parallel to peripheral edge P of reinforcement structure 200' with intervening beams 212 being perpendicular to peripheral edge P. As shown, beams 212 perpendicular to peripheral edge P may be longer than beams 212 parallel thereto; however, all beams may be of equal length, or beams 212 parallel to peripheral edge P may be longer than beams 212 perpendicular thereto. The beams 212 parallel to peripheral edge P and closest in proximity thereto may be located between about 5 µm to about 10 µm inward from peripheral edge P. As illustrated in FIG. 3B, reinforcement structure 200' extends between the major surfaces MS1 and MS2 of RDL structure 104", and is electrically isolated from the conductive traces 112 as well as contacts 110 and 120 and from peripheral edge P by intervening low-k dielectric material 118. Reinforcement structure 200', like reinforcement structure 200, comprises levels of conductive material in the form of beams 212 connected vertically by intervening beams 212 at adjacent levels. Viewed from the perspective of FIG. 3B, it can be seen that portions of the beams 212 perpendicular to peripheral edge P extend laterally between beams 212 parallel to peripheral edge P and connecting adjacent levels of beams 212 perpendicular to peripheral edge P. As shown, beams 212 parallel to peripheral edge P may be located proximate, and exposed on, each major surface MS1 and MS2 of RDL structure 104". In another embodiment, beams 212 parallel to peripheral edge P may be located below a level of low-k dielectric material 118 on each major surface MS1 and MS2 of RDL structure 104", and beams 212 perpendicular to peripheral edge P may be exposed. As shown in FIG. 3B, column elements 214e shown in broken lines, may, optionally, be located to extend between mutually vertically superimposed beams 212. Referring to FIG. 3C, in another implementation of reinforcement structure 200', rather than various levels of alternating levels of beams 212 respectively perpendicular and parallel to peripheral edge P forming a zig-zag pattern, two or more different levels of beams 212 may instead follow opposite zig-zag patterns as depicted, respectively, in a solid line Z1 and a broken line Z2, wherein beams 212 perpendicular to peripheral edge P are vertically superimposed (broken line Z2 slightly offset for clarity) and beams 212 parallel to peripheral edge P are offset at different distances from peripheral edge P. Column elements 214e (not shown in FIG. 3C) may extend between adjacent levels of superimposed beams 212. Referring to FIG. 3D, in a further implementation of reinforcement structure 200', beams 212 on different levels both parallel and perpendicular to peripheral edge P may be offset parallel to peripheral edge P in a phase-shifted manner as depicted, respectively, in solid line Z1 and broken line Z2 (broken line slightly offset for clarity), and vertically superimposed beams 212 parallel to peripheral edge connected by interposed column elements 214e, not shown in FIG. 3D. Of course, greater than two levels of beams 212 may be mutually offset in a phase-shifted manner.

It will be appreciated that reinforcement structure 200', as in the case of reinforcement structure 200, may be formed simultaneously with the remainder of RDL structure 104", by appropriate blanket deposition of levels of conductive material and low-k dielectric material 118 layer by layer in conjunction with appropriate patterning and material removal, as known to those of ordinary skill in the art, as described above with respect to reinforcement structure 200.

It will also be apparent to those of ordinary skill in the art that one or more levels of beams 212 may be configured in a zig-zag pattern, while other levels may be configured with all beams 212 lying parallel to a peripheral edge P of a reinforcement structure 200. Further, patterns other than zig-zag may be easily configured by appropriate patterning of conductive material, so that, for example, a continuous beam in a sinusoidal pattern may be formed, rather than a zig-zag pattern approximating a square wave.

In one embodiment, a redistribution layer (RDL) structure comprises at least one level of conductive traces between adjacent levels of low-k dielectric material and a reinforcement structure comprising conductive material proximate and inwardly of a periphery of the RDL structure, the reinforcement structure electrically isolated from the at least one level of conductive traces and extending between a first major surface and a second major surface of the RDL structure.

In another embodiment, a semiconductor device package comprises a semiconductor die, a redistribution layer (RDL) structure electrically connected on one major surface thereof to the semiconductor die, the RDL structure comprising one or more levels of conductive traces, at least some of the conductive traces extending laterally beyond a periphery of the semiconductor die, contacts electrically connected to the conductive traces defining a pattern for terminal pads on another, opposing major surface of the RDL structure, external conductive elements protruding from the terminal pads and reinforcement structure extending between the major surfaces of the RDL structure, comprising conductive material electrically isolated from the conductive traces and conductive contacts, and located peripherally inwardly of and adjacent edges of the RDL structure.

In a further embodiment, a method of fabricating a redistribution layer (RDL) structure comprises forming a level of low-k dielectric material with a selected periphery for an RDL structure, forming and patterning a level of conductive material on and extending into at least one hole in the level of low-k dielectric material to define conductive traces, at least one contact in communication with at least one conductive trace, and conductive elements of a reinforcement structure laterally separated and electrically isolated from the conductive traces adjacent the selected periphery. Another level of low-k dielectric material is formed over the patterned level of conductive material with holes to expose a portion of at least one conductive trace and one or more conductive elements of the reinforcement structure. Another level of conductive material is formed on and extending into at least one hole in the another level of low-k dielectric material to contact the exposed portion of the at least one conductive trace and the one or more conductive elements of the reinforcement structure and the level of conductive material is patterned to define conductive traces and conductive elements of the reinforcement structure laterally separated and electrically isolated from the conductive traces adjacent the selected periphery. A further level of low-k dielectric material is formed with holes to expose a portion of at least one conductive trace and one or more conductive elements of the reinforcement structure, and the holes in the further level of low-k dielectric material are filled with conductive material to form at least one contact in communication with the at least one conductive trace and one or more conductive elements of the reinforcement structure.

Embodiments of the disclosure provide a reinforcement structure to an RDL structure adjacent the periphery thereof and electrically isolated from conductive paths of the RDL structure. The reinforcement structure may mechanically interlock with low-k dielectric materials of the RDL structure and may prevent or reduce tendencies of these relatively fragile dielectric materials to delaminate, crack or otherwise degrade under thermal, mechanical or residual stresses by providing a robust, continuous, multilevel peripheral barrier to arrest crack propagation and/or redirect crack propagation through the low-k dielectric material in a non-detrimental direction. The extension of such a reinforcement structure, as disclosed, between opposing major surfaces of an RDL structure incorporating same may add structural rigidity to semiconductor device packages employing such RDL structures. Continuity and structural integrity of the reinforcement structure may be easily confirmed during electrical testing of the RDL structure conductive paths by contacting exposed portions of the conductive material of the reinforcement structures at various locations to detect shorting.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A redistribution layer (RDL) structure, comprising:
   at least one level of conductive traces between adjacent levels of low-k dielectric material; and
   a reinforcement structure comprising first beams extending parallel to and inward of a periphery of the RDL structure, each of the first beams having a first length, and second beams extending perpendicular to the periphery, each of the second beams having a second length, the second length equal to, or greater than, the first length, each of the second beams connected to two of the first beams, the reinforcement structure comprised of a conductive material, the reinforcement structure electrically isolated from the at least one level of conductive traces and extending between a first major surface and a second major surface of the RDL structure;
   wherein the first beams and the second beams define a square-wave pattern when viewed from the first major surface.

2. The RDL structure of claim 1, wherein the reinforcement structure comprises two or more levels and the first beams are in a first level and the second beams are in a second level.

3. The RDL structure of claim 2, wherein the first beams are exposed on the first major surface.

4. The RDL structure of claim 2, wherein the second beams are exposed on the first major surface.

5. The RDL structure of claim 2, further comprising third beams extending parallel to and beneath the first beams in a third level below the second level, the first beams connected to the third beams by column elements.

6. The RDL structure of claim 1, further comprising:
   a first level, the first beams arranged in the first level;

a second level beneath the first level, the second beams arranged in the second level;
a third level beneath the second level;
third beams arranged in the third level, the third beams parallel to the first beams;
a fourth level beneath the third level; and
fourth beams arranged in the fourth level, the fourth beams parallel to the second beams.

7. The RDL structure of claim 6, wherein each of the second beams is above a corresponding one of the fourth beams and a majority of a length of each of the first beams is not above any of the third beams.

8. The RDL structure of claim 6, wherein a portion of a length of each of the first beams is above a corresponding one of the third beams and each of the second beams is not above any of the fourth beams.

9. A redistribution layer (RDL) structure, comprising:
two or more levels of conductive traces between adjacent levels of low-k dielectric material; and
a reinforcement structure comprising a conductive material, the reinforcement structure electrically isolated from the two or more levels of conductive traces, the reinforcement structure extending between a first major surface and a second major surface of the RDL structure, the reinforcement structure comprising multiple levels of beams, the multiple levels of beams proximate to and inward of a periphery of the RDL structure, the multiple levels of beams comprising:
a first level including first beams parallel to one another;
a second level including second beams parallel to one another and perpendicular to the first beams; and
a third level, the second level between the first level and the third level, the third level including third beams extending parallel to and beneath the first beams, the first beams connected to the third beams by column elements.

10. The RDL structure of claim 9, wherein the multiple levels of beams define a square-wave pattern when viewed from the first major surface of the RDL structure.

11. The RDL structure of claim 9, the multiple levels of beams further comprising:
a fourth level, the third level between the second level and the fourth level, the fourth level including fourth beams, the fourth beams parallel to one another and parallel to the second beams.

12. The RDL structure of claim 11, wherein the multiple levels of beams define a square-wave pattern when viewed from a first major surface of the RDL structure and wherein each of the second beams is above a corresponding one of the fourth beams and a majority of a length of each of the first beams is not above any of the third beams.

13. The RDL structure of claim 11, wherein the multiple levels of beams define a square-wave pattern when viewed from the first major surface of the RDL structure and wherein a portion of a length of each of the first beams is above a corresponding one of the third beams and each of the second beams is not above any of the fourth beams.

14. The RDL structure of claim 9, wherein the first beams and the second beams define a first square-wave pattern when viewed from the first major surface and the multiple levels of beams include two additional levels, the two additional levels including beams that when viewed from the first major surface define a second square-wave pattern.

15. The RDL structure of claim 14, wherein the first square-wave pattern is offset from the second square-wave pattern.

16. The RDL structure of claim 15, wherein the first square-wave pattern is offset from the second square-wave pattern by 180 degrees of phase.

17. A semiconductor device package comprising:
a semiconductor die;
a redistribution layer (RDL) structure electrically connected on a first major surface thereof to the semiconductor die, the RDL structure comprising:
one or more levels of conductive traces, at least some of the one or more levels of conductive traces extending laterally beyond a periphery of the semiconductor die;
contacts electrically connected to the one or more levels of conductive traces defining a pattern for terminal pads on a second major surface of the RDL structure;
external conductive elements protruding from the terminal pads; and
a reinforcement structure extending between the first major surface of the RDL structure and the second major surface of the RDL structure, the reinforcement structure including mulitples levels of mutually parallel beams, the mutually parallel beams of adjacent levels defining a square-wave pattern extending parallel to and inward of each peripheral edge of the RDL structure, the reinforcement structure comprising a conductive material, and the reinforcement structure electrically isolated from the one or more levels of conductive traces and the contacts.

* * * * *

UNITED STATES PATENT AND TRADEMARK OFFICE
CERTIFICATE OF CORRECTION

PATENT NO. : 11,887,920 B2
APPLICATION NO. : 16/952703
DATED : January 30, 2024
INVENTOR(S) : Hyunsuk Chun, Chan H. Yoo and Tracy N. Tennant It is certified that error appears in the above-identified patent and that said Letters Patent is hereby corrected as shown below:

In the Claims

| | | | |
|---|---|---|---|
| Claim 12, | Column 12, | Line 1, | change "from a first" to --from the first-- |
| Claim 17, | Column 12, | Line 39, | change "including mulitples levels" to --including multiple levels-- |

Signed and Sealed this
Second Day of April, 2024

Katherine Kelly Vidal
*Director of the United States Patent and Trademark Office*